United States Patent
Xi et al.

(10) Patent No.: US 9,455,753 B2
(45) Date of Patent: Sep. 27, 2016

(54) NON-LINEAR CAPACITANCE BASED PARAMETRIC MIXER

(71) Applicant: Samsung Electronics Co., Ltd., Suwon-si, Gyeonggi-do (KR)

(72) Inventors: Tianzuo Xi, Waltham, MA (US); Daquan Huang, Allen, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/677,775

(22) Filed: Apr. 2, 2015

(65) Prior Publication Data

US 2015/0326257 A1  Nov. 12, 2015

Related U.S. Application Data

(60) Provisional application No. 61/989,322, filed on May 6, 2014.

(51) Int. Cl.
| | |
|---|---|
| *H03D 7/16* | (2006.01) |
| *H04B 1/04* | (2006.01) |
| *H04B 1/40* | (2015.01) |
| *H03D 7/14* | (2006.01) |

(Continued)

(52) U.S. Cl.
CPC ............ *H04B 1/0475* (2013.01); *H03D 7/125* (2013.01); *H03D 7/1441* (2013.01); *H03D 7/1458* (2013.01); *H03D 7/1466* (2013.01); *H03D 7/1483* (2013.01); *H03D 7/1491* (2013.01); *H04B 1/26* (2013.01); *H04B 1/40* (2013.01); *H04B 2001/0491* (2013.01)

(58) Field of Classification Search
CPC .................. H04B 2001/0491; H04B 1/0475; H04B 1/40; H03D 7/1491
USPC ........................................................ 455/131
See application file for complete search history.

(56) References Cited

U.S. PATENT DOCUMENTS

| | | |
|---|---|---|
| 3,226,645 A | 12/1965 | Harwood et al. |
| 3,383,601 A | 5/1968 | Squires |
| 4,158,177 A | 6/1979 | Archambault et al. |

(Continued)

FOREIGN PATENT DOCUMENTS

| | | |
|---|---|---|
| KR | 20020041951 A | 6/2002 |
| WO | WO 2006/015367 A1 | 2/2006 |

OTHER PUBLICATIONS

Extended European Search Report in connection with European Application 15166624.5; Sep. 3, 2015; 7 pages.

(Continued)

*Primary Examiner* — Eugene Yun

(57) ABSTRACT

A method and apparatus for frequency conversion. The apparatus includes a mixer configured to provide an output signal with a converted frequency, a local oscillator, and a non-linear transmission structure operably connected to the mixer and the local oscillator. The non-linear transmission structure is configured to cancel at least a portion of non-linearity of the mixer from the output signal and to modify a gain of the output signal. The local oscillator may provide a local oscillator signal to the non-linear transmission structure. The non-linear transmission structure may also be configured to modify the local oscillator signal to cancel at least the portion of the non-linearity of the mixer and to modify the gain of the output signal, and provide the modified local oscillator signal to the mixer.

20 Claims, 7 Drawing Sheets

(51) Int. Cl.
*H04B 1/26* (2006.01)
*H03D 7/12* (2006.01)

(56) References Cited

U.S. PATENT DOCUMENTS

| | | |
|---|---|---|
| 8,018,267 B2 | 9/2011 | Kang et al. |
| 8,035,483 B2 | 10/2011 | Song et al. |
| 2003/0007377 A1 | 1/2003 | Otaka |
| 2007/0273454 A1* | 11/2007 | Pepper ............................ 333/20 |
| 2008/0254759 A1 | 10/2008 | Kintis et al. |
| 2011/0190028 A1* | 8/2011 | Hahn et al. ................ 455/550.1 |
| 2014/0185726 A1 | 7/2014 | Kitsunezuka |

OTHER PUBLICATIONS

Adnan, et al.; "Phase Matching using Bandgap Structures for Efficient Parametric Frequency Conversion"; Proceedings of the 41st European Microwave Conference; Manchester, UK; Oct. 10-13, 2011; pp. 639-642.

Blake Raymond Gray; "Design of RF and Microwave Parametric Amplifiers and Power Upconverters"; Georgia Institute of Technology; May 2012; 114 pages.

Magierowski, et al.; "RF CMOS Parametric Downconverters"; IEEE Transactions on Microwave Theory and Techniques, Vol, 58, No. 3: Mar. 2010; pp. 518-528.

* cited by examiner

NON-LINEAR CAPACITANCE BASED PARAMETRIC MIXER

CROSS-REFERENCE TO RELATED APPLICATION(S) AND CLAIM OF PRIORITY

The present application claims priority to U.S. Provisional Patent Application Ser. No. 61/989,322, filed May 6, 2014, entitled "NON-LINEAR CAPACITANCE BASED PARAMETRIC MIXERS". The content of the above-identified patent document is incorporated herein by reference.

TECHNICAL FIELD

This disclosure relates generally to frequency conversion in communication devices. More specifically, this disclosure relates to non-linear capacitance based parametric mixers.

BACKGROUND

Frequency mixers or mixers are a key component in radio frequency (RF) transceiver front-ends and are ubiquitously used in wireless communication system components including, for example, RF Identification (RFID) transceivers, RF tags, and RF sensor networks. Complementary metal-oxide-semiconductor (CMOS) mixers are a cost effective solution for many RF mixer applications. Nevertheless, the active mixers (e.g., mixers with trans-conductance stage to provide conversion gain) suffer from high noise figure (NF), poor linearity, and high power consumption, while the passive mixers (e.g., mixers with no trans-conductance stage and thus no conversion gain) suffer from high conversion loss.

SUMMARY

This disclosure provides a non-linear capacitance based parametric mixer.

In one embodiment, an apparatus for improved frequency conversion is provided. The apparatus includes a mixer configured to provide an output signal with a converted frequency, a local oscillator, and a non-linear transmission structure operably connected to the mixer and the local oscillator. The non-linear transmission structure is configured to cancel at least a portion of non-linearity of the mixer from the output signal and to modify a gain of the output signal.

In another embodiment, a method for frequency conversion is provided. The method includes providing, by a mixer, an output signal with a converted frequency. Additionally, the method includes canceling at least a portion of non-linearity of the mixer from the output signal and modifying a gain of the output signal using a non-linear transmission structure operably connected to the mixer and a local oscillator.

In yet another embodiment, a wireless communication device with improved frequency conversion is provided. The wireless communication device includes a mixer configured to provide an output signal with a converted frequency, a local oscillator configured to provide a local oscillator signal to a non-linear transmission structure, and the non-linear transmission structure operably connected to the mixer and the local oscillator. The non-linear transmission structure is configured to modify the local oscillator signal to cancel at least a portion of the non-linearity of the mixer from the output signal and to modify the gain of the output signal, and provide the modified local oscillator signal to the mixer.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system or part thereof that controls at least one operation. Such a controller may be implemented in hardware or a combination of hardware and software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which.

DETAILED DESCRIPTION

FIGS. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably-arranged wireless communication system.

Figure 1:
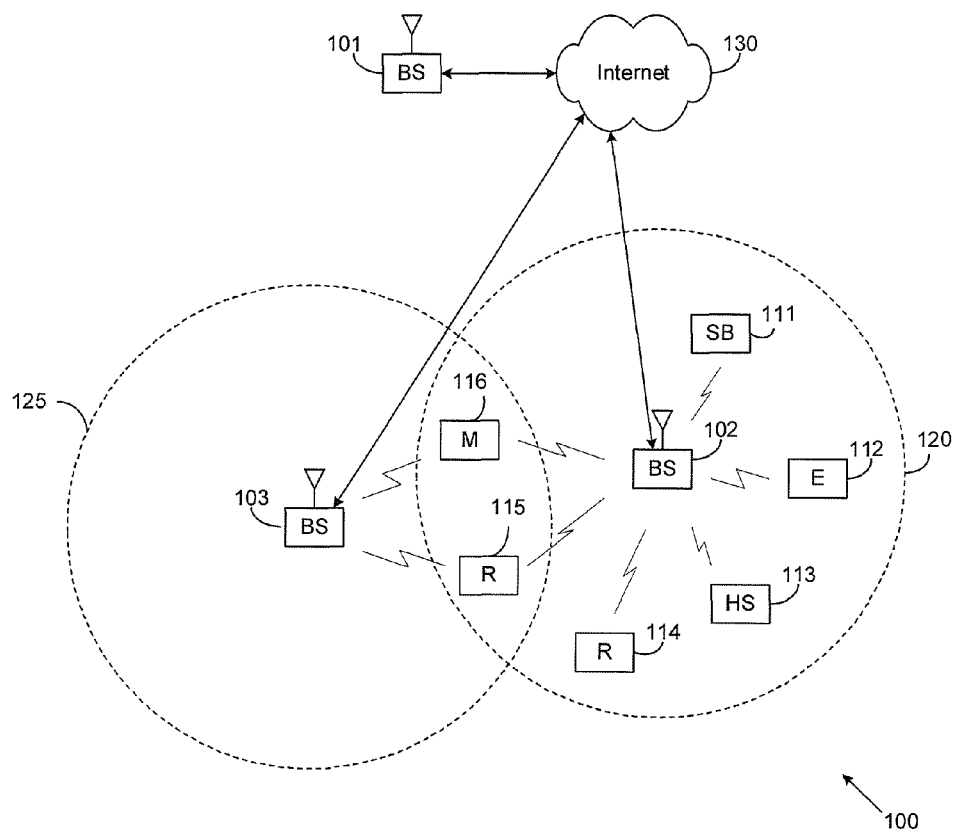
FIG. 1 illustrates an example wireless network according to this disclosure.

FIG. 1 illustrates an example wireless network 100 according to this disclosure. The embodiment of the wireless network 100 shown in FIG. 1 is for illustration only. Other embodiments of the wireless network 100 could be used without departing from the scope of this disclosure.

As shown in FIG. 1, the wireless network 100 includes an eNodeB (eNB) 101, an eNB 102, and an eNB 103. The eNB 101 communicates with the eNB 102 and the eNB 103. The eNB 101 also communicates with at least one network 130, such as the Internet, a proprietary Internet Protocol (IP) network, or other data network.

The eNB 102 provides wireless broadband access to the network 130 for a first plurality of user equipments (UEs) within a coverage area 120 of the eNB 102. The first plurality of UEs includes a UE 111, which may be located in a small business (SB); a UE 112, which may be located in an enterprise (E); a UE 113, which may be located in a WiFi hotspot (HS); a UE 114, which may be located in a first residence (R); a UE 115, which may be located in a second residence (R); and a UE 116, which may be a mobile device (M), like a cell phone, a wireless laptop, a wireless PDA, or the like. The eNB 103 provides wireless broadband access to the network 130 for a second plurality of UEs within a coverage area 125 of the eNB 103. The second plurality of UEs includes the UE 115 and the UE 116. In some embodiments, one or more of the eNBs 101-103 may communicate with each other and with the UEs 111-116 using 5G, LTE, LTE-A, WiMAX, WiFi, Cellular, WLAN, Bluetooth, Zig-Bee, Wi-XLE, or other wireless communication techniques.

Depending on the network type, other well-known terms may be used instead of "eNodeB" or "eNB," such as "base station" or "access point." For the sake of convenience, the terms "eNodeB" and "eNB" are used in this patent document to refer to network infrastructure components that provide wireless access to remote terminals. Also, depending on the network type, other well-known terms may be used instead of "user equipment" or "UE," such as "mobile station," "subscriber station," "remote terminal," "wireless terminal," or "user device." For the sake of convenience, the twins "user equipment" and "UE" are used in this patent document to refer to remote wireless equipment that wirelessly accesses an eNB, whether the UE is a mobile device (such as a mobile telephone or smartphone) or is normally considered a stationary device (such as a desktop computer or vending machine).

Dotted lines show the approximate extents of the coverage areas 120 and 125, which are shown as approximately circular for the purposes of illustration and explanation only. It should be clearly understood that the coverage areas associated with eNBs, such as the coverage areas 120 and 125, may have other shapes, including irregular shapes, depending upon the configuration of the eNBs and variations in the radio environment associated with natural and man-made obstructions.

As described in more detail below, one or more of the eNBs and/or UEs may include circuitry for performing antenna array self-calibration. Although FIG. 1 illustrates one example of a wireless network 100, various changes may be made to FIG. 1. For example, the wireless network 100 could include any number of eNBs and any number of UEs in any suitable arrangement. Also, the eNB 101 could communicate directly with any number of UEs and provide those UEs with wireless broadband access to the network 130. Similarly, each eNB 102-103 could communicate directly with the network 130 and provide UEs with direct wireless broadband access to the network 130. Further, the eNBs 101, 102, and/or 103 could provide access to other or additional external networks, such as external telephone networks or other types of data networks.

Figure 2:
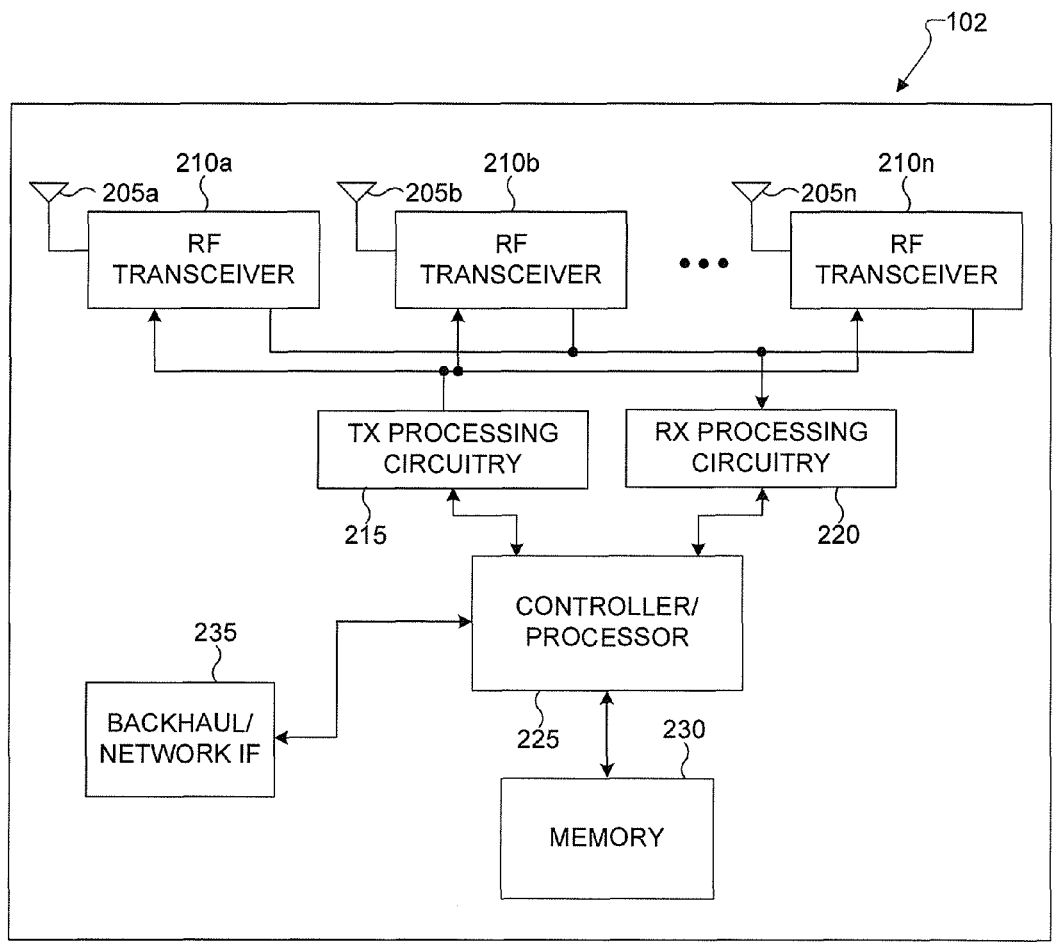
FIG. 2 illustrates an example eNodeB (eNB) according to this disclosure.

FIG. 2 illustrates an example eNB 102 according to this disclosure. The embodiment of the eNB 102 illustrated in FIG. 2 is for illustration only, and the eNBs 101 and 103 of FIG. 1 could have the same or similar configuration. However, eNBs come in a wide variety of configurations, and FIG. 2 does not limit the scope of this disclosure to any particular implementation of an eNB.

As shown in FIG. 2, the eNB 102 includes multiple antennas 205a-205n, multiple RF transceivers 210a-210n, transmit (TX) processing circuitry 215, and receive (RX) processing circuitry 220. The eNB 102 also includes a controller/processor 225, a memory 230, and a backhaul or network interface 235.

The RF transceivers 210a-210n receive, from the antennas 205a-205n, incoming RF signals, such as signals transmitted by UEs in the network 100. The RF transceivers 210a-210n down-convert the incoming RF signals to generate IF or baseband signals. The IF or baseband signals are sent to the RX processing circuitry 220, which generates processed baseband signals by filtering, decoding, and/or digitizing the baseband or IF signals. The RX processing circuitry 220 transmits the processed baseband signals to the controller/processor 225 for further processing.

The TX processing circuitry 215 receives analog or digital data (such as voice data, web data, e-mail, or interactive video game data) from the controller/processor 225. The TX processing circuitry 215 encodes, multiplexes, and/or digitizes the outgoing baseband data to generate processed baseband or IF signals. The RF transceivers 210a-210n receive the outgoing processed baseband or IF signals from the TX processing circuitry 215 and up-converts the baseband or IF signals to RF signals that are transmitted via the antennas 205a-205n.

The controller/processor 225 can include one or more processors or other processing devices that control the overall operation of the eNB 102. For example, the controller/processor 225 could control the reception of forward channel signals and the transmission of reverse channel signals by the RF transceivers 210a-210n, the RX processing circuitry 220, and the TX processing circuitry 215 in accordance with well-known principles. The controller/processor 225 could support additional functions as well, such as more advanced wireless communication functions. For instance, the controller/processor 225 could support beam forming or directional routing operations in which outgoing signals from multiple antennas 205a-205n are weighted differently to effectively steer the outgoing signals in a desired direction. Any of a wide variety of other functions could be supported in the eNB 102 by the controller/processor 225. In some embodiments, the controller/processor 225 includes at least one microprocessor or microcontroller.

The controller/processor 225 is also capable of executing programs and other processes resident in the memory 230, such as an OS. The controller/processor 225 can move data into or out of the memory 230 as required by an executing process.

The controller/processor 225 is also coupled to the backhaul or network interface 235. The backhaul or network interface 235 allows the eNB 102 to communicate with other devices or systems over a backhaul connection or over a network. The interface 235 could support communications over any suitable wired or wireless connection(s). For example, when the eNB 102 is implemented as part of a cellular communication system (such as one supporting 50, LTE, or LTE-A), the interface 235 could allow the eNB 102 to communicate with other eNBs over a wired or wireless backhaul connection. When the eNB 102 is implemented as an access point, the interface 235 could allow the eNB 102 to communicate over a wired or wireless local area network or over a wired or wireless connection to a larger network (such as the Internet). The interface 235 includes any suitable structure supporting communications over a wired or wireless connection, such as an Ethernet or RF transceiver.

The memory 230 is coupled to the controller/processor 225. Part of the memory 230 could include a RAM, and another part of the memory 230 could include a Flash memory or other ROM.

As described in more detail below, the eNB 102 may include a non-linear capacitance based parametric mixer. For example, one, more than one, or all of the transceivers 210 may include a non-linear capacitance based parametric mixer for frequency conversion with improved linearity and gain. Although FIG. 2 illustrates one example of eNB 102, various changes may be made to FIG. 2. For example, the eNB 102 could include any number of each component shown in FIG. 2. As a particular example, an access point could include a number of interfaces 235, and the controller/processor 225 could support routing functions to route data between different network addresses. As another particular example, while shown as including a single instance of TX processing circuitry 215 and a single instance of RX processing circuitry 220, the eNB 102 could include multiple instances of each (such as one per RF transceiver). Also, various components in FIG. 2 could be combined, further subdivided, or omitted and additional components could be added according to particular needs.

Figure 3:
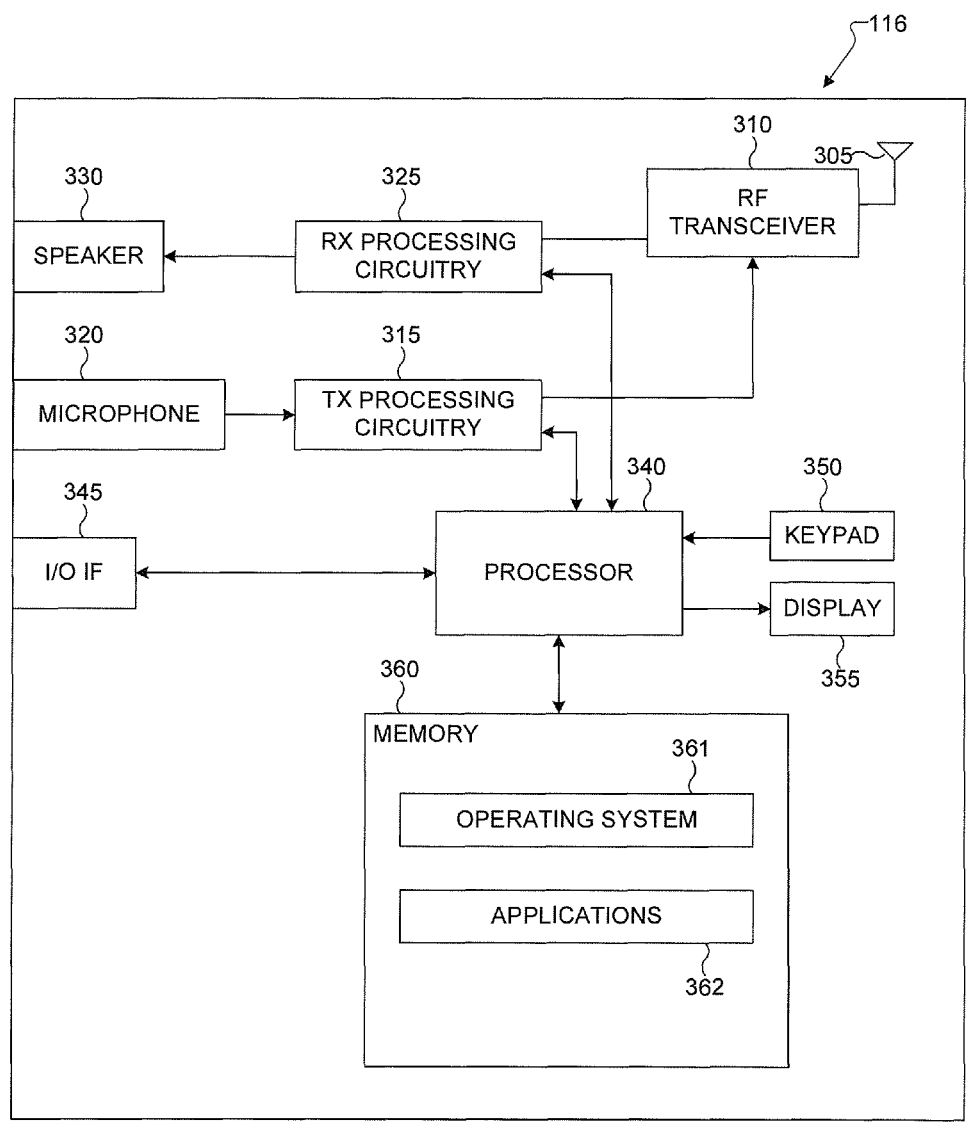
FIG. 3 illustrates an example user equipment (UE) according to this disclosure.

FIG. 3 illustrates an example UE 116 according to this disclosure. The embodiment of the UE 116 illustrated in FIG. 3 is for illustration only, and the UEs 111-115 of FIG. 1 could have the same or similar configuration. However, UEs come in a wide variety of configurations, and FIG. 3 does not limit the scope of this disclosure to any particular implementation of a UE.

As shown in FIG. 3, the UE 116 includes an antenna 305, a radio frequency (RF) transceiver 310, TX processing circuitry 315, a microphone 320, and receive (RX) processing circuitry 325. The UE 116 also includes a speaker 330, a processor 340, an input/output (I/O) interface 345, a keypad 350, a display 355, and a memory 360. The memory 360 includes an operating system (OS) 361 and one or more applications 362.

The RF transceiver 310 receives, from the antenna 305, an incoming RF signal transmitted by an eNB of the network 100. The RF transceiver 310 down-converts the incoming RF signal to generate an intermediate frequency (IF) or baseband signal. The IF or baseband signal is sent to the RX processing circuitry 325, which generates a processed baseband signal by filtering, decoding, and/or digitizing the baseband or IF signal. The RX processing circuitry 325 transmits the processed baseband signal to the speaker 330 (such as for voice data) or to the processor 340 for further processing (such as for web browsing data).

The TX processing circuitry 315 receives analog or digital voice data from the microphone 320 or other outgoing baseband data (such as web data, e-mail, or interactive video game data) from the processor 340. The TX processing circuitry 315 encodes, multiplexes, and/or digitizes the outgoing baseband data to generate a processed baseband or IF signal. The RF transceiver 310 receives the outgoing processed baseband or IF signal from the TX processing circuitry 315 and up-converts the baseband or IF signal to an RF signal that is transmitted via the antenna 305.

The processor 340 can include one or more processors or other processing devices and execute the OS 361 stored in the memory 360 in order to control the overall operation of the UE 116. For example, the processor 340 could control the reception of forward channel signals and the transmission of reverse channel signals by the RF transceiver 310, the RX processing circuitry 325, and the TX processing circuitry 315 in accordance with well-known principles. In some embodiments, the processor 340 includes at least one microprocessor or microcontroller.

The processor 340 is also capable of executing other processes and programs resident in the memory 360. The processor 340 can move data into or out of the memory 360 as required by an executing process. In some embodiments, the processor 340 is configured to execute the applications 362 based on the OS 361 or in response to signals received from eNBs or an operator. The processor 340 is also coupled to the I/O interface 345, which provides the UE 116 with the ability to connect to other devices, such as laptop computers and handheld computers. The I/O interface 345 is the communication path between these accessories and the processor 340.

The processor 340 is also coupled to the keypad 350 and the display 355. The operator of the UE 116 can use the keypad 350 to enter data into the UE 116. The display 355 may be a liquid crystal display or other display capable of rendering text and/or at least limited graphics, such as from web sites.

The memory 360 is coupled to the processor 340. Part of the memory 360 could include a random access memory (RAM), and another part of the memory 360 could include a Flash memory or other read-only memory (ROM).

As described in more detail below, the UE 116 may include a non-linear capacitance based parametric mixer. For example, the RF transceiver 310 may include a non-linear capacitance based parametric mixer for frequency conversion with improved linearity and gain. Although FIG. 3 illustrates one example of UE 116, various changes may be made to FIG. 3. For example, various components in FIG. 3 could be combined, further subdivided, or omitted and additional components could be added according to particular needs. As a particular example, the processor 340 could be divided into multiple processors, such as one or more central processing units (CPUs) and one or more graphics processing units (GPUs). Also, while FIG. 3 illustrates the UE 116 configured as a mobile telephone or smartphone, UEs could be configured to operate as other types of mobile or stationary devices.

Embodiments of the present disclosure recognize that active mixers (e.g., mixers with trans-conductance stage to provide conversion gain) suffer from high noise figure (NF), poor linearity, and high power consumption, while the passive mixers (e.g., mixers with no trans-conductance stage and thus have no conversion gain) suffer from high conversion loss. For example, mixer output signal gain is often maintained at the expense of linearity and mixer output signal gain linearity at the expense of gain. Accordingly, embodiments of the present disclosure provide a high linearity, low noise passive mixer with maintained or improved conversion voltage gain by using parametric non-linear amplification.

Figure 4A:
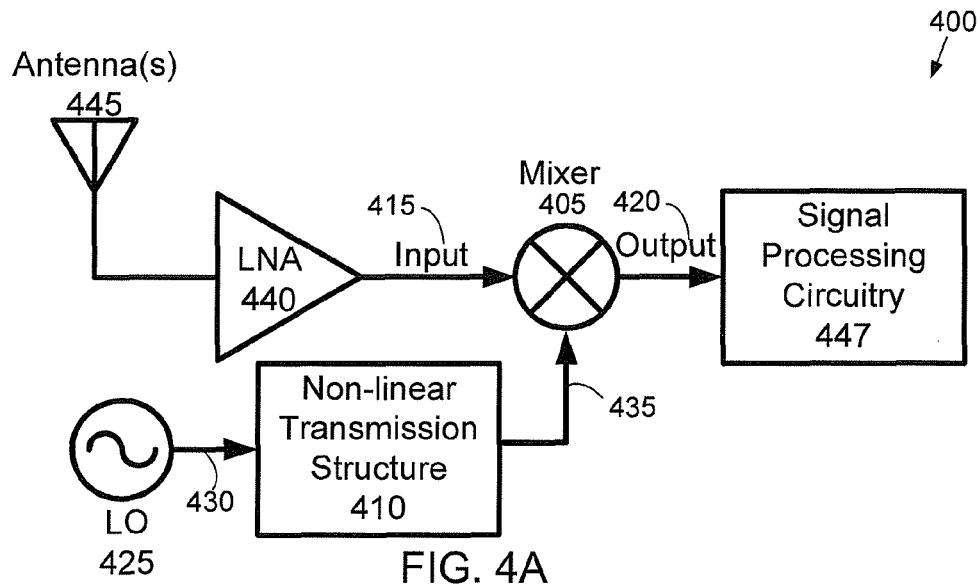
FIGS. 4A and 4B illustrate block diagrams of a non-linear parametric mixer in a receiver and transmitter, respectively, according to illustrative embodiments of this disclosure.
Figure 4B:
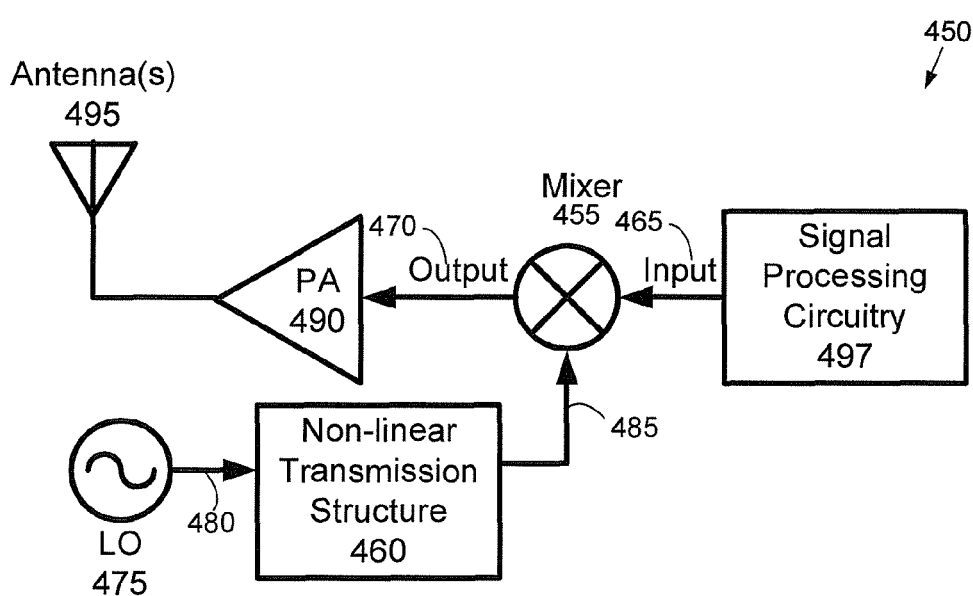

FIGS. 4A and 4B illustrate block diagrams of a non-linear parametric mixer in a receiver 400 and a transmitter 450, respectively, according to illustrative embodiments of this disclosure. For example, the receiver 400 and the transmitter 450 may present in a transceiver, such as RF transceivers 210 in FIG. 2 or RF transceiver 310 in FIG. 3.

The non-linear parametric mixer implemented in accordance with various embodiments of the present disclosure includes a mixer 405 or 455 in connection with a non-linear transmission structure 410 or 460. In this illustrative example, the mixers 405 and 455 (or frequency mixers) are devices that convert the frequency of input signals 415 and 465 into output signals 420 and 470, respectively, having frequencies at plus and minus of the frequency supplied by the local oscillators (LOs) 425 and 475, respectively (e.g., at $f_{o1}=f_i+f_{LO}$ and $f_{o2}=f_i-f_{LO}$). The output signal at the undesired frequency may be filtered out leaving output signals 420 and 470 at a desired converted frequency. For example, the mixers 405 and 455 may be a passive return-to-zero (RZ) or non-return-to-zero (NRZ) sampling mixer. In other examples, any non-linear device, such as varactors, MOS transistors, MOS capacitors, diodes, and other devices with PN junctions, can be used as mixers to perform frequency conversion.

Embodiments of the present disclosure recognize that highly non-linear devices are used in mixers to yield high conversion gain but at the price of poor frequency conversion linearity. The present disclosure decouples the mixer conversion gain and linearity so that the conversion gain and the linearity can be optimized, improved, and/or selected independently to achieve high gain and linearity simultaneously. This is achieved using the non-linear transmission structures 410 and 460 to supply parametric amplification to periodically modulate or to reshape the LO signals 430 and 480 waveform. The parametrically amplified LO signals 435 and 485 (or pump signals) become higher, narrower, and sharper, which allows the mixers 405 and 455 to operate as a switch for higher conversion gain, lower noise, and less loss. All the while, the parametrically amplified LO signals 435 and 485 cancel the non-linearity of the mixers 405 and 455 for highly or increasingly linear output. The mixers 405 and 455 of embodiments of the present disclosure operate in the passive mode resulting in little to no DC power consumption and less noise.

The topology of this embodiment of the present disclosure separates the conversion gain from the non-linearity, allowing simultaneous modification, control, improvement, and/or optimization for both gain and linearity. As such, the mixers 405 and 455 may operate as a switch and be configured for focus on higher conversion gain, while the non-linear transmission structures 410 and 460 supply a signal to cancel the expected higher levels of non-linearity as a result of the mixers 405 and 455 configured for higher conversion gain. For example, the mixers 405 and 455 may be a switch-mode device (e.g., a MOS transistor, a Bipolar transistor, a field-effect transistor (FET), or other types of switches) in the RF signal path for higher conversion gain and less loss without scarifying the linearity of the output signal. Additionally, given the higher conversion gains, the mixers of the present disclosure can directly drive the next stage circuit (e.g., IF amplifier for the receiver 400 or the power amplifier (PA) 490 for the transmitter 450) without the need of an additional amplifier stage to amplify the output of the mixers 405 and 455.

The non-linear transmission structures 410 and 460 include non-linear components that modify and/or parametrically amplify the LO signals 430 and 480, respectively, to produce output signals 435 and 485. These output signals 435 and 485, when provided to the mixers 405 and 455, can modify (e.g., increase or decrease) the gain of the outputs (420 and 470) of the mixers 405 and 455, and cancel out at least some, if not all or most, of the non-linearity of the mixers 405 and 455 being programmed, focused, or otherwise configured for higher conversion gains. The non-linearity of the non-linear components in the non-linear transmission structures 410 and 460 may be pre-selected based on the operating parameters of the receiver or transmitter (e.g., RF or IF operating frequencies, non-linearity of the mixers 405 and 455, LO frequency, etc.) and/or may be programmable or reconfigurable to parametrically adjust signals 435 and 485, for example, based on changes in any of the operating parameters or based on feedback regarding non-linearity or gain deficiencies in remaining for output signals 420 and 470.

For example, the non-linear transmission structures 410 and 460 may include one or more soliton structures, which include transmission line or inductor and non-linear capacitor (e.g., varactor or metal-oxide-semiconductor (MOS) capacitor) to reshape the LO signals 430 and 480 to further improve circuit performance. The soliton structure(s) in the non-linear transmission structures 410 and 460 to reshape the LO/pump signal (e.g., making the pump signal edge sharper, width narrower, and amplitude higher) to further improve conversion gain, port isolation, linearity, and noise performance. In other examples, without limitation, the non-linear components in the non-linear transmission structures 410 and 460 may be a shunt non-linear capacitor, varactor, MOS capacitor, diode, or any other non-linear capacitor.

As illustrated in FIG. 4A, the mixer 405 and non-linear transmission structure 410 may be implemented in a receiver

400 where signal 415 is received by antenna(s) 445 at RF, low-noise amplified by low-noise amplifier (LNA) 440, and down-converted from RF to an intermediate frequency (IF) of the receiver for signal processing (e.g., IF filtering, variable gain amplification (VGA), analog-to-digital (ADC) conversion and/or baseband (BB) signal processing, etc.) by signal processing circuitry 447. Additionally, as illustrated in FIG. 4B, the mixer 455 and non-linear transmission structure 460 may be implemented in a transmitter 450 where signal 465 received from signal processing circuitry 497 (e.g., after BB signal processing, DAC conversion, and/or VGA, etc.) is up-converted from IF to RF and output for amplification by PA 490 and transmission by antenna(s) 495.

The embodiment of receiver 400 and transmitter 450 illustrated in FIGS. 4A and 4B is for illustration only. Other embodiments of the receiver 400 and transmitter 450 could be used without departing from the scope of this disclosure. For example, one or more of the components illustrated may be removed or re-positioned along the RX and TX paths, and additional standard wireless communication components may be included. The receiver 400 and/or transmitter 450 may be implemented in any wireless communication device including, for example, without limitation, base stations, eNB, relay stations, UEs, access points, RFID transceivers, RF tags, RF sensor networks, etc.

Figure 5:
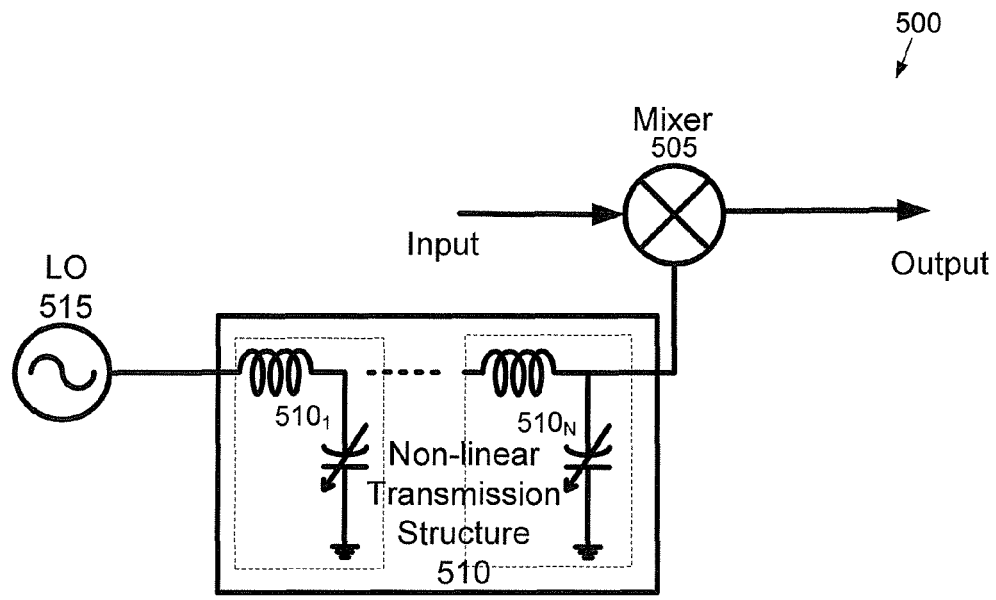
FIG. 5 illustrates a block diagram of parametric passive mixer circuitry including non-linear transmission structure section(s) according to illustrative embodiments of this disclosure.

FIG. 5 illustrates a block diagram of parametric passive mixer circuitry 500 including non-linear transmission structure section(s) according to illustrative embodiments of this disclosure. The mixer circuitry 500 may be implemented in a receiver or transmitter, such as the receiver 400 and/or transmitter 450 illustrated in FIGS. 4A and 4B, respectively. The embodiment of mixer circuitry 500 illustrated in FIG. 5 is for illustration only. Other embodiments of the parametric passive mixer circuitry 500 could be used without departing from the scope of this disclosure.

The mixer circuitry 500 includes a mixer 505 (e.g., such as the mixers 405 and 455 in the RF signal path), one or multiple sections of a non-linear transmission structure 510 (e.g., such as a soliton structure comprising either a series transmission line or inductor and a shunt non-linear capacitor (e.g., a varactor, MOS capacitor, diode, or any other non-linear capacitor), and a LO 515.

In this illustrative example, the non-linear transmission structure 510 may include one or multiple sections of a soliton structure soliton non-linear transmission line. The non-linear transmission structure 510 may include additional sections $510_n$ to increase the amplification of the output signal of the non-linear transmission structure 510 supplied to the mixer 505 to thereby increase the gain of the output from the mixer 505. The non-linear capacitance may also compensate for the dispersion in the transmission line.

In one example embodiment, the mixer circuitry 500 may include a preset number of sections $510_n$ that are connected to modify the signal from the LO 515. In another embodiment, multiple sections $510_n$ may be connectable (e.g., by a switch or relay or pair of switches) with the number of sections $510_n$ that are connected being selected (e.g., by a controller or processor) based on the operating parameters of the device (e.g., receiver or transmitter) in which the mixer circuitry 500 is present. In one example, each section $510_n$ may add about a 3 dB voltage gain for a 120 GHz signal in a 65 nm bulk CMOS mixer.

Figure 6:
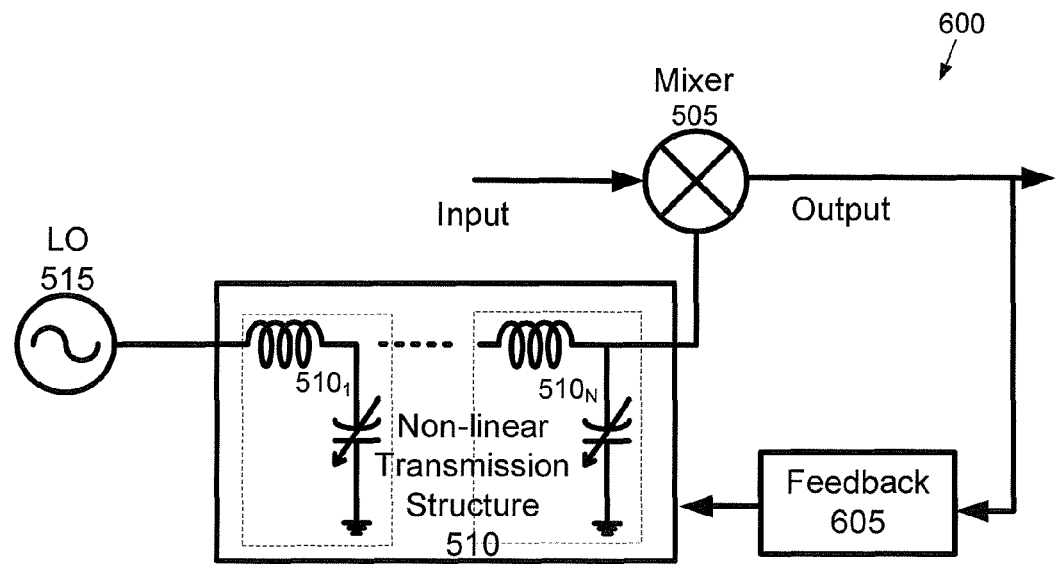
FIG. 6 illustrates a block diagram of parametric passive mixer circuitry including non-linear transmission structure section(s) and feedback controls according to illustrative embodiments of this disclosure.

FIG. 6 illustrates a block diagram of parametric passive mixer circuitry 600 including non-linear transmission structure section(s) and feedback controls according to illustrative embodiments of this disclosure. The mixer circuitry 600 may be implemented in a receiver or transmitter, such as the receiver 400 and/or transmitter 450 illustrated in FIGS. 4A and 4B, respectively. The embodiment of mixer circuitry 600 illustrated in FIG. 6 is for illustration only. Other embodiments of the mixer circuitry 600 could be used without departing from the scope of this disclosure.

In this illustrative embodiment, the mixer circuitry 600 is an embodiment of the mixer circuitry 500 including a feedback loop 605 for at least partial closed loop feedback/control of the parameters used by the non-linear transmission structure 510 in modifying the LO signal. For example, a device controller, BB processing circuitry, or special purpose circuitry may sample or otherwise identify an amount of non-linearity remaining in the output from the mixer 505 and control to adjust or supply a signal for the non-linear transmission structure 510 to adjust the parameters by the non-linear transmission structure 510 in modifying the LO signal. For example, the non-linear transmission structure 510 may adjust a bias point of one or more of the varactors or non-linear capacitors included in the non-linear transmission structure 510 to further adjust the amount of non-linearity of the mixer 505 canceled by the pump signal provided from the non-linear transmission structure 510 to the mixer.

Figure 7A:
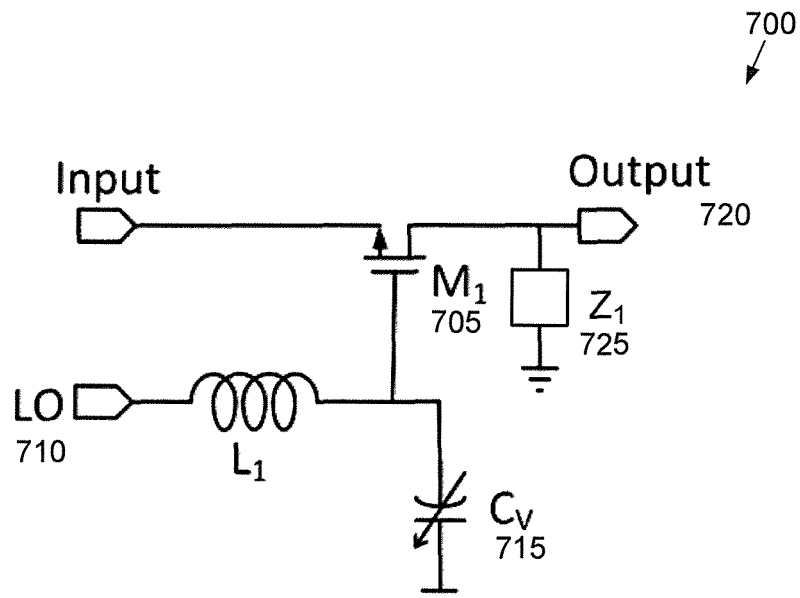
FIGS. 7A and 7B illustrate example single-ended and differential parametric passive mixer circuitry, respectively, according to illustrative embodiments of this disclosure.
Figure 7B:
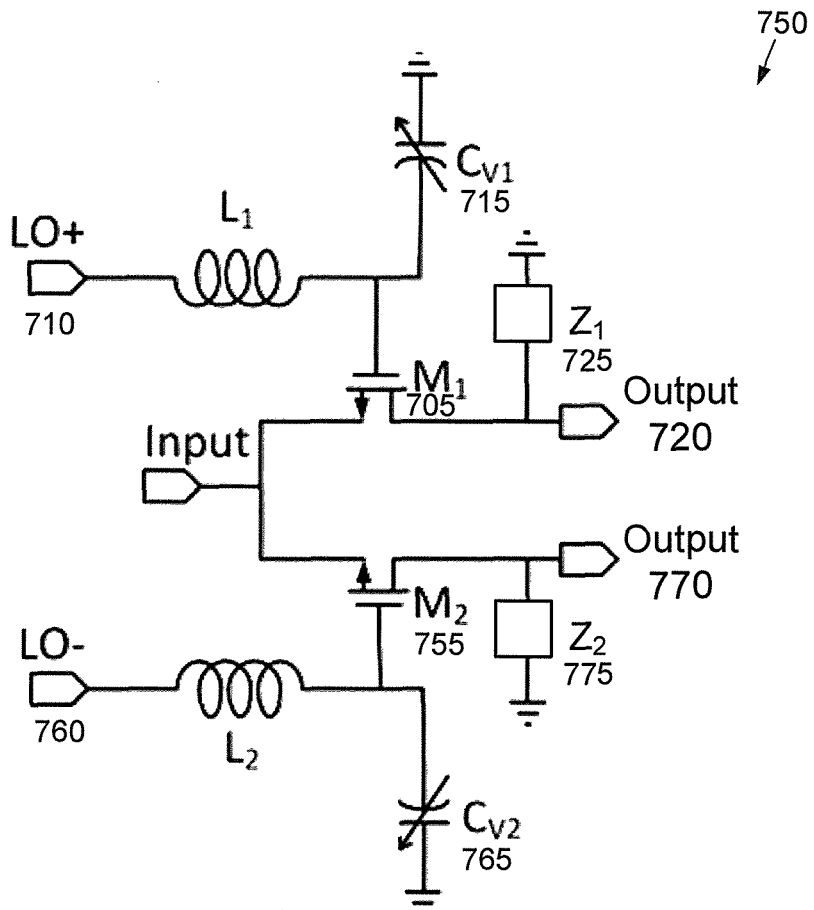

FIGS. 7A and 7B illustrate example single-ended and differential parametric passive mixer circuitry, respectively, according to illustrative embodiments of this disclosure. The parametric passive mixer circuitry 700 and 750 may be implemented in a receiver or transmitter, such as the receiver 400 and/or transmitter 450 illustrated in FIGS. 4A and 4B, respectively. The embodiment of mixer circuitry 700 and 750 illustrated in FIGS. 7A and 7B is for illustration only. Other embodiments of the parametric passive mixer circuitry 700 and 750 could be used without departing from the scope of this disclosure.

In these example embodiments, mixer circuitry 700 is an implementation of a single-ended passive mixer, such as discussed above with regard to FIGS. 5 and 6, for example. Mixer circuitry 750 is an implementation of a differential (or single-balanced) passive mixer. As illustrated in FIG. 7B, an additional mixer ($M_2$) 755, LO 760, and non-linear capacitor ($C_{v2}$) 765 are included, which generate an output 770 that is a differential of the output 720 produced from mixer ($M_1$) 705, LO 710, and non-linear capacitor ($C_{v1}$) 715. In this manner, the differential output signal 770 balances and/or cancels out distortion, noise, and/or interference that may be present in the output 720. In some embodiments, the impedances $Z_1$ 725 and $Z_2$ 775 may be a resistor or capacitor load. In some embodiments, only one LO 710 or 760 may be utilized with the LO input into the other of the mixers 750 or 755 being a differential of the signal output from the single LO 710 or 760.

Figure 8:
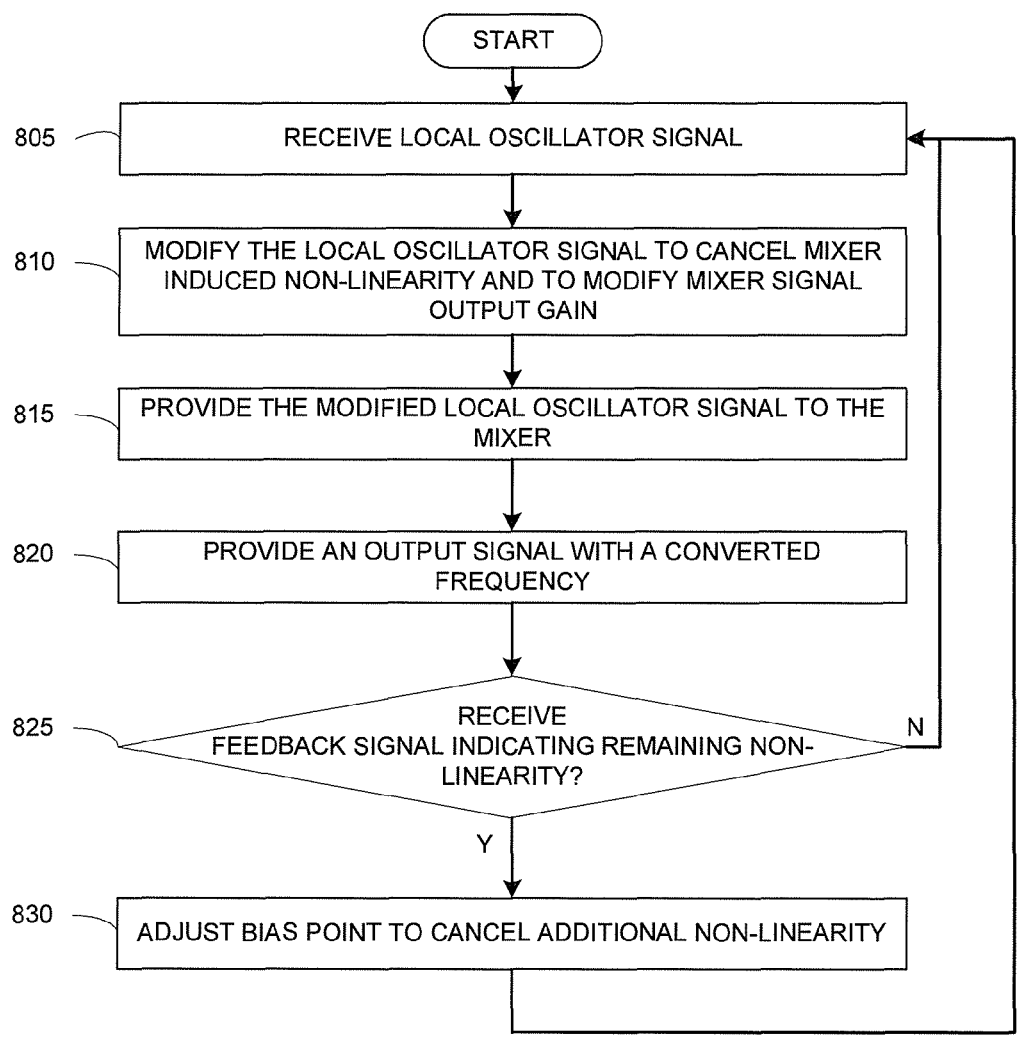
FIG. 8 illustrates a process for frequency conversion in accordance with various embodiments of the present disclosure.

FIG. 8 illustrates a process for frequency conversion in accordance with various embodiments of the present disclosure. For example, the process depicted in FIG. 8 may be performed by a receiver or a transmitter, such as the receiver 400 and/or transmitter 450 illustrated in FIGS. 4A and 4B, as well as by a controller or processor controlling operation of the receiver or transmitter.

The process begins with a non-linear transmission structure receiving a local oscillator signal (step 805). For example, in step 805, the non-linear transmission structure (e.g., 410 or 460) may receive the local oscillator signal from a local oscillator (e.g., 425 or 475). Thereafter, the non-linear transmission structure modifies the LO signal to cancel mixer induced non-linearity and to modify mixer signal output gain (step 810). For example, in step 810, the non-linear transmission structure may include one or more sections of non-linear components, such as a soliton structure(s) and/or non-linear capacitor to reshape the LO signal (e.g., make the pump signal edge sharper, width narrower, and amplitude higher) to improve conversion gain, port isolation, linearity, and noise performance of the output of the mixer when provided to the mixer.

The non-linear transmission structure then provides the modified LO signal to the mixer (step 815). For example, in step 815, the non-linear transmission structure may provide the modified LO (or pump) signal to the mixer to cancel at least the portion of the non-linearity of the mixer and to modify (e.g., increase) the gain of the output signal. For example, the non-linear transmission structure may include multiple soliton structure(s), each of which supplies additional gain. In another example, the mixer may be configured for high or maximum gain, and no increase or even a decrease in gain may be caused by the pump signal. For example, the gain portion of the output of the mixer may be provided by the mixer with the non-linear transmission structure providing the linearity. Thereafter, the mixer provides an output signal with a converted frequency (step 820). For example, in step 820, the output signal may have both a high gain and high linearity simultaneously.

For embodiments utilizing partial closed loop feedback control, the non-linear transmission structure may also determine whether a feedback signal indicating remaining non-linearity has been received (step 825). For example, in step 825, a controller, BB signal processing, or special purpose feedback loop may sample the output of the mixer and provide a feedback signal that indicates an amount of remaining non-linearity in the output. Thereafter, the non-linear transmission structure or a controller of the transmitter or receiver may cause the bias point of one or more non-linear capacitor(s) or varactor(s) in the non-linear transmission structure to cancel additional non-linearity (step 830). For example, the feedback and adjustment steps may be continually or periodically repeated to improve and/or optimize the signal provided to the mixer to achieve desired gain and/or linearity in the output of the mixer.

Although FIG. 8 illustrates an example of a process for frequency conversion, various changes could be made to FIG. 8. For example, while shown as a series of steps, various steps could overlap, occur in parallel, occur in a different order, or occur multiple times. Additionally, one or more of the steps in FIG. 8 may not be performed in one or more embodiments of the present disclosure.

Embodiments of the present disclosure provide a new type of mixer with high linearity, high conversion voltage gain, low noise, and zero DC power. Various embodiments of the present disclosure achieve wide bandwidth (e.g., DC to over 10 GHz) of the IF output. This is one of the key features for any high-speed or wide bandwidth systems, such as 60 GHz applications, high-speed Serializer/Deserializer (SerDes), and optical data link systems. The conversion gain may be rather low at low IF frequency outputs. Embodiments of the present disclosure may use wide bandwidth switches (or mixers) and apply the parametric pump signal to the LO signal provided to the switches (or mixers). Because of the gain and non-linearity separation, the mixer of the present disclosure can be used in a direct conversion system. For example, embodiments of the present disclosure may down-convert a 120/60 GHz or any other RF signal directly to the baseband, which can simplify the circuitry topology and the complexity as well as the frequency planning for low-power operations with smaller die size (cost).

Although the present disclosure has been described with an exemplary embodiment, various changes and modifications may be suggested to one skilled in the art. It is intended that the present disclosure encompass such changes and modifications as fall within the scope of the appended claims.

None of the description in this application should be read as implying that any particular element, step, or function is an essential element that must be included in the claim scope. The scope of patented subject matter is defined only by the claims. Moreover, none of the claims is intended to invoke 35 U.S.C. §112(f) unless the exact words "means for" are followed by a participle.

What is claimed is:

1. An apparatus comprising:
   a mixer configured to provide an output signal with a converted frequency;
   a local oscillator; and
   a non-linear transmission structure operably connected to and positioned between the mixer and the local oscillator, the non-linear transmission structure configured to provide parametric amplification of a signal received from the local oscillator to periodically modulate or reshape the local oscillator signal, to cancel at least a portion of non-linearity of the mixer from the output signal, and to modify a gain of the output signal.

2. The apparatus of claim 1, wherein:
   the local oscillator is configured to provide the local oscillator signal to the non-linear transmission structure, and
   the non-linear transmission structure is configured to modify the local oscillator signal to cancel at least the portion of the non-linearity of the mixer and to modify the gain of the output signal, and provide the modified local oscillator signal to the mixer.

3. The apparatus of claim 1, wherein the non-linear transmission structure includes at least one of a non-linear capacitor and a varactor configured to modify a linearity of the local oscillator signal to cancel at least the portion of the non-linearity of the mixer.

4. The apparatus of claim 3, wherein the non-linear transmission structure is further configured to receive a feedback signal indicating an amount of non-linearity remaining in the output signal, and to adjust a bias point of the at least one non-linear capacitor or varactor to cancel additional non-linearity from the output signal.

5. The apparatus of claim 1, wherein the non-linear transmission structure includes at least one Soliton structure.

6. The apparatus of claim 1, wherein the non-linear transmission structure includes a plurality of Soliton structure sections and is configured to connect one or more of the Soliton structure sections based on a desired gain of the output signal.

7. The apparatus of claim 1, wherein the local oscillator is configured to provide the local oscillator signal to the non-linear transmission structure, the apparatus further comprising:
   a second mixer configured to receive a same input signal as the mixer, and to provide a second output signal with a converted frequency; and
   a second non-linear transmission structure operably connected to the second mixer, the non-linear transmission structure configured to receive and modify a differential local oscillator signal to cancel at least a portion of non-linearity of the second mixer from the second output signal and to modify a gain of the second output signal.

8. The apparatus of claim 7, the apparatus further comprising a second mixer configured to provide the differential local oscillator to the second non-linear transmission structure.

9. A method for frequency conversion, the method comprising:
providing, by a mixer, an output signal with a converted frequency; and
canceling at least a portion of non-linearity of the mixer from the output signal and modifying a gain of the output signal using a non-linear transmission structure configured to provide parametric amplification of a signal received from a local oscillator to periodically modulate or reshape the local oscillator signal, the non-linear transmission structure operably connected to and positioned between the mixer and the local oscillator.

10. The method of claim 9, wherein canceling at least the portion of non-linearity of the mixer from the output signal and modifying a gain of the output signal using a non-linear transmission structure operably connected to the mixer and a local oscillator comprises:
receiving the local oscillator signal from the local oscillator;
modifying the local oscillator signal to cancel at least the portion of the non-linearity of the mixer and to modify the gain of the output signal using the non-linear transmission structure; and
providing the modified local oscillator signal to the mixer.

11. The method of claim 9, wherein the non-linear transmission structure includes at least one of a non-linear capacitor and a varactor configured to modify a linearity of the local oscillator signal to cancel at least the portion of the non-linearity of the mixer.

12. The method of claim 11, further comprising:
receiving a feedback signal indicating an amount of non-linearity remaining in the output signal; and
adjusting a bias point of the at least one non-linear capacitor or varactor to cancel additional non-linearity from the output signal.

13. The method of claim 9, wherein the non-linear transmission structure includes at least one Soliton structure.

14. The method of claim 9, wherein the non-linear transmission structure includes a plurality of Soliton structure sections and is configured to connect one or more of the Soliton structure sections based on a desired gain of the output signal.

15. The method of claim 9, wherein the local oscillator provides the local oscillator signal to the non-linear transmission structure, the method further comprising:
receiving, at a second mixer, a same input signal as the mixer and providing, by the second mixer, a second output signal with a converted frequency; and
receiving and modifying, using a second non-linear transmission structure operably connected to the second mixer, a differential local oscillator signal to cancel at least a portion of non-linearity of the second mixer from the second output signal and to modify a gain of the second output signal.

16. The method of claim 15, wherein the differential local oscillator is provided to the second non-linear transmission structure by a second mixer.

17. A wireless communication device comprising:
a mixer configured to provide an output signal with a converted frequency;
a local oscillator configured to provide a local oscillator signal to a non-linear transmission structure; and
the non-linear transmission structure operably connected to and positioned between the mixer and the local oscillator, the non-linear transmission structure configured to:
provide parametric amplification of the local oscillator signal to periodically modulate or to reshape the local oscillator signal to cancel at least a portion of the non-linearity of the mixer from the output signal and to modify a gain of the output signal; and
provide the modified local oscillator signal to the mixer.

18. The wireless communication device of claim 17, further comprising receive processing circuitry comprising the mixer and the non-linear transmission structure, wherein the converted frequency is an intermediate frequency for the receive processing circuitry.

19. The wireless communication device of claim 17, further comprising transmit processing circuitry comprising the mixer and the non-linear transmission structure, wherein the converted frequency is a radio frequency for the transmit processing circuitry.

20. The wireless communication device of claim 17, wherein the wireless communication device is one of a user equipment and an eNodeB.

* * * * *